(12) United States Patent
Ati et al.

(10) Patent No.: US 6,686,241 B2
(45) Date of Patent: Feb. 3, 2004

(54) METHOD OF FORMING LOW-RESISTIVITY CONNECTIONS IN NON-VOLATILE MEMORIES

(75) Inventors: Massimo Ati, Bologna (IT); Alfonso Maurelli, Sulbiate (IT); Nicola Zatelli, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 258 days.

(21) Appl. No.: 09/798,778

(22) Filed: Mar. 2, 2001

(65) Prior Publication Data
US 2001/0049176 A1 Dec. 6, 2001

(51) Int. Cl.⁷ .................... H01L 21/336; H01L 21/4763
(52) U.S. Cl. .................. 438/257; 438/618; 438/622; 438/637
(58) Field of Search ................ 438/257, 618, 438/622, 629, 637

(56) References Cited

U.S. PATENT DOCUMENTS 5,814,850 A  9/1998  Iwasa ................. 257/296
6,197,639 B1 * 3/2001 Lee et al. .................... 438/258
6,291,296 B1 * 9/2001 Hui et al. ..................... 438/257

FOREIGN PATENT DOCUMENTS

| EP | 0 655 775 A1 | 5/1995 |
| EP | 0 738 003 A2 | 10/1996 |
| EP | 0 938 136 A1 | 8/1999 |

\* cited by examiner

*Primary Examiner*—T. N. Quach
(74) *Attorney, Agent, or Firm*—Lisa K. Jorgenson; David V. Carlson; Seed IP Law Group PLLC

(57) ABSTRACT

The method applies to non-volatile semiconductor memories with cells arranged in rows and in columns, in which each cell has a first terminal, a second terminal, and a third terminal connected, respectively, to a row line, to a column line, and to a common node by respective connection strips. In order to form connections with low resistivity and consequently to save semiconductor area, the method provides for the formation of an oxide layer which covers the connection strips of the first terminals and of the third terminals, the formation of channels along the connection strips until the surfaces thereof are exposed, and the filling of the channels with a material having a resistivity lower than that of the connection strips.

12 Claims, 3 Drawing Sheets

METHOD OF FORMING LOW-RESISTIVITY CONNECTIONS IN NON-VOLATILE MEMORIES

TECHNICAL FIELD

The present invention relates to a method of forming low-resistivity connections in a non-volatile memory and to a memory with low-resistivity connections formed by the method.

BACKGROUND OF THE INVENTION

To give an example of a typical field of use of the invention, a known programmable non-volatile memory (EPROM) structure formed on a monocrystalline silicon substrate with p conductivity is described below with reference to FIGS. 1 and 2. The invention is intended, however, to be applied advantageously to any type of non-volatile memory which requires low-resistivity connections.

FIG. 1 shows in plan a portion of a memory matrix which contains ten cells arranged in two rows and five columns and FIG. 2 is a section taken on the line II—II of FIG. 1 through two cells of a column.

In the following description, the direction of the rows will be defined as horizontal and the direction of the columns will be defined as vertical. The active regions, that is, the regions of the substrate which are separated from one another by thick oxide (field oxide) are indicated by hatching.

Two cells of the same column have their drain regions, indicated D, in common, and their source regions, indicated S, connected to the source regions of the cells belonging to the same row by regions, indicated R, which are formed in the substrate simultaneously with the source and drain regions by diffusion of n-type impurities. Floating gate electrodes of doped polycrystalline silicon, indicated FG, are formed on two regions disposed above the channels which separate the source and drain regions of each cell, and are insulated from the substrate by respective thin layers of gate oxide. Strips CG of doped polycrystalline silicon comprising the control gate electrodes of the EPROM cells extend horizontally above the floating gate electrodes FL, which are insulated therefrom by an oxide layer I1. Metal strips M1G, shown as defined between broken lines in FIG. 1, extend horizontally above the control gate strips CG of each row, and are insulated therefrom by an oxide layer I2. Interconnection elements V1 which extend through the oxide layer I2 put the metal strips M1G into contact with the underlying polycrystalline silicon strips CG. A further oxide layer I3 covers the metal strips M1G.

Source metal strips SL extend vertically on the insulating layer I3 and are in contact with the diffused regions R connecting the source regions S of the cells of the various rows by means of interconnection elements which extend through the dielectric material of the various superimposed insulating layers I3, I2, I1 and are shown in FIG. 1 by small squares indicated V2. The vertical metal strips SL are spaced apart horizontally by predetermined distances and are connected together, in a manner not shown, to a common terminal which is usually the lower-potential terminal of the integrated circuit in which the memory matrix is formed.

Metal drain strips M2D extend vertically on the insulation layer I3 and each is in contact with the drain regions D of the cells of a column by means of interconnection elements which are similar to those between the strips SL and the regions R, and each of is which shown in plan (FIG. 1) by a small square indicated V3 and in section (FIG. 2) by three superimposed conductive elements, that is, a column V31, a connector V32, and an interconnection via V33.

The gate metal strips M1G constitute the word lines (WLi) of the matrix and the drain metal strips M2D constitute the bit lines (BLi) of the memory matrix, whilst the metal strips SL constitute the connections of the source regions of the cells to the common source terminal.

Briefly, to produce the structure shown, a layer of polycrystalline silicon is deposited on a thin layer of gate dielectric (silicon dioxide formed on the surfaces of the active regions by thermal oxidation). The polycrystalline silicon layer is etched by usual photolithography techniques to define the polycrystalline silicon floating gate electrodes FL, which are separated from the substrate by the gate dielectric. Ions of a doping element with n conductivity are implanted in the portions of the substrate which are not covered by the floating gate electrodes FL to form the source regions S and the drain regions D of the cells and the regions R joining the source regions and to dope the polycrystalline silicon of the floating gate electrodes FL. A layer of silicon dioxide (I1) is deposited, followed by a second layer of doped polycrystalline silicon. This second polycrystalline silicon layer is also etched by usual photolithography techniques to define the horizontal strips CG which contain the control gate electrodes of the cells. A second silicon dioxide layer (I2) is deposited, contact areas are opened up in predetermined positions of the layer, more precisely, on the diffused regions R, on the drain regions D, and on the strips CG. A layer of metal, for example, tungsten, is deposited and selectively removed to form the lower portions of the interconnection elements V2 and V3, amongst which are the columns V31. A layer of metal, for example, aluminum, is then deposited on the silicon dioxide layer I2 and on the portions of the underlying polycrystalline silicon strips CG which are exposed by the contact areas, thus forming the interconnection elements V1, and the horizontal metal strips M1G and the connections V32 are formed by photolithography. A third silicon dioxide layer I3 is deposited, contact areas are opened up through the oxide layer I3, and a second metal layer, for example, aluminum again, is then deposited and forms the interconnection vias V33. The source interconnection strips SL and the drain interconnection strips M2D are formed by photolithography from this second metal layer.

The horizontal metal strips M1G have the function of connecting the respective polycrystalline silicon strips which form the control gate electrodes of the cells of each row to corresponding external terminals (not shown) of the matrix of cells by a low-resistivity path, as will be explained further below, and constitute the word lines WLi. The vertical metal strips M2D have the function of interconnecting the drain terminals of the cells of the columns of the matrix and constitute the bit lines BLi. The vertical metal strips SL have the function of connecting the source regions of all of the cells to a common terminal.

When the memory is in operation, currents pass through both the polycrystalline silicon strips CG of the control gate electrodes and the regions R joining the source regions. These currents cause voltage drops which depend on the resistivities of the materials of which the strips CG and the regions R are made. Memory cells which are disposed at different distances from a terminal of the matrix are therefore biased differently. The resistivities are fixed by design criteria which cannot generally be changed. In practice it is therefore necessary to arrange the contacts V1 between the polycrystalline silicon strips CG and the metal strips M1G as well as the contacts V2 between the regions R joining the source regions and the source connection strips SL, at distances such as to render the voltage drops negligible. However, the contacts need to occupy area on the substrate. The overall area occupied by the contacts is larger the larger are the dimensions of the memory matrix. Since the tendency at the moment is to design memories of ever greater capacity on ever smaller areas, there is a great need for novel structures and novel methods of forming low-resistivity connections.

In order to reduce the resistivity of the connections, it is known to treat the monocrystalline or polycrystalline silicon surfaces by depositing on them thin layers of metals which can react with the silicon, forming silicides, when they are heated to a relatively high temperature. However, these techniques are quite difficult when the surfaces to be treated have very small dimensions or have raised portions, as in the case of very highly integrated non-volatile memories formed by a method such as that described above.

SUMMARY OF THE INVENTION

The invention provides an improved method for reducing the resistivity of connections within a semiconductor chip. It is particularly helpful for non-volatile memories. A structure according to the method is also provided.

The method applies to semiconductor memories with cells arranged in rows and in columns, in which each cell has a first terminal, a second terminal, and a third terminal connected, respectively, to a row line, to a column line, and to a common node by respective connection strips. In order to form connections with low resistivity and to save semiconductor area, the method provides for the formation of an oxide layer which covers the connection strips of the first terminals and of the third terminals, the formation of channels along the connection strips until the surfaces thereof are exposed, and the filling of the channels with a material having a resistivity lower than that of the connection strips.

DETAILED DESCRIPTION OF THE INVENTION

Figures 1, 2:
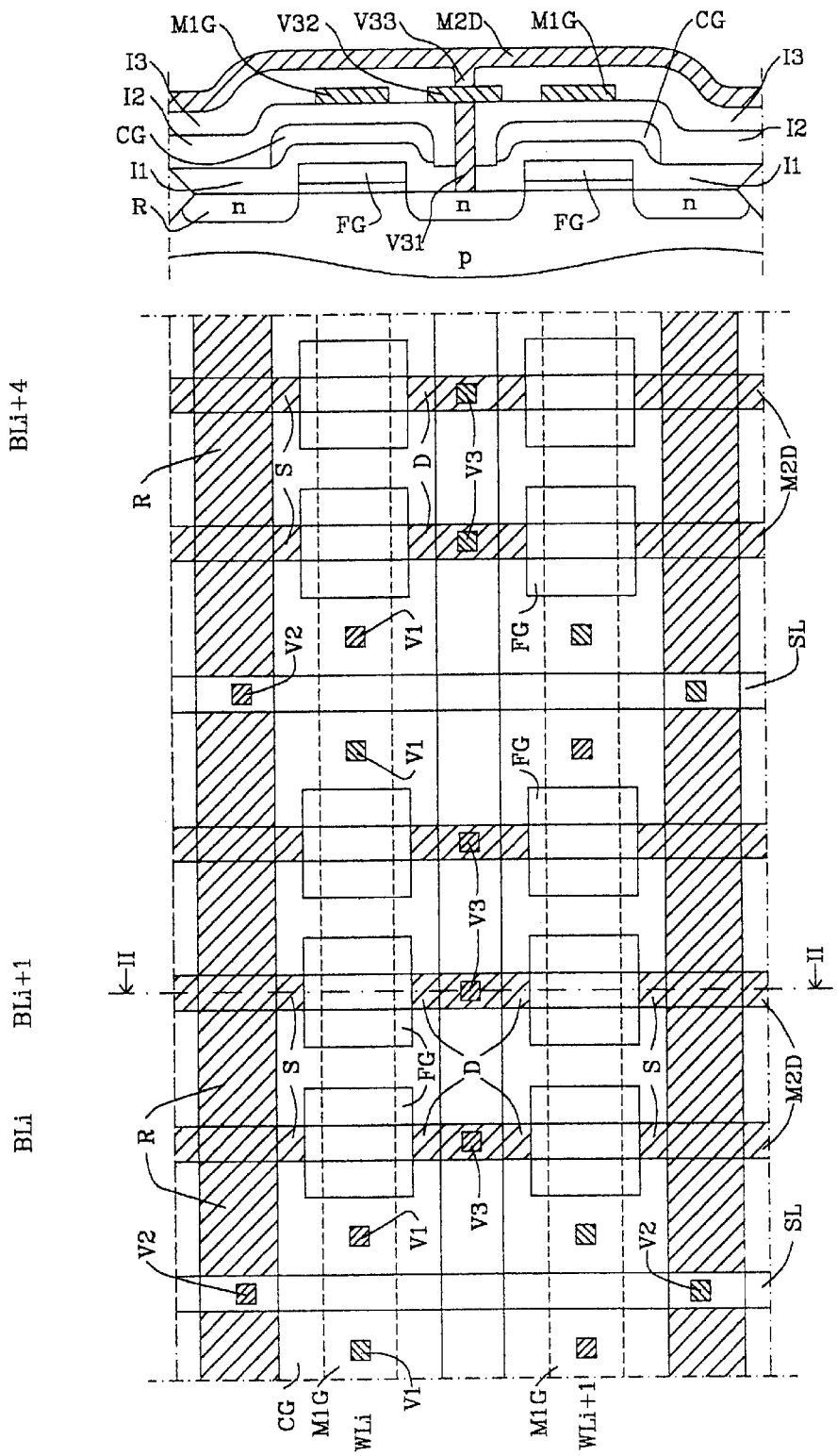
FIG. 1 shows a portion of a known non-volatile memory, in plan.
FIG. 2 shows a section taken on the line II—II of FIG. 1.
Figures 3, 4:
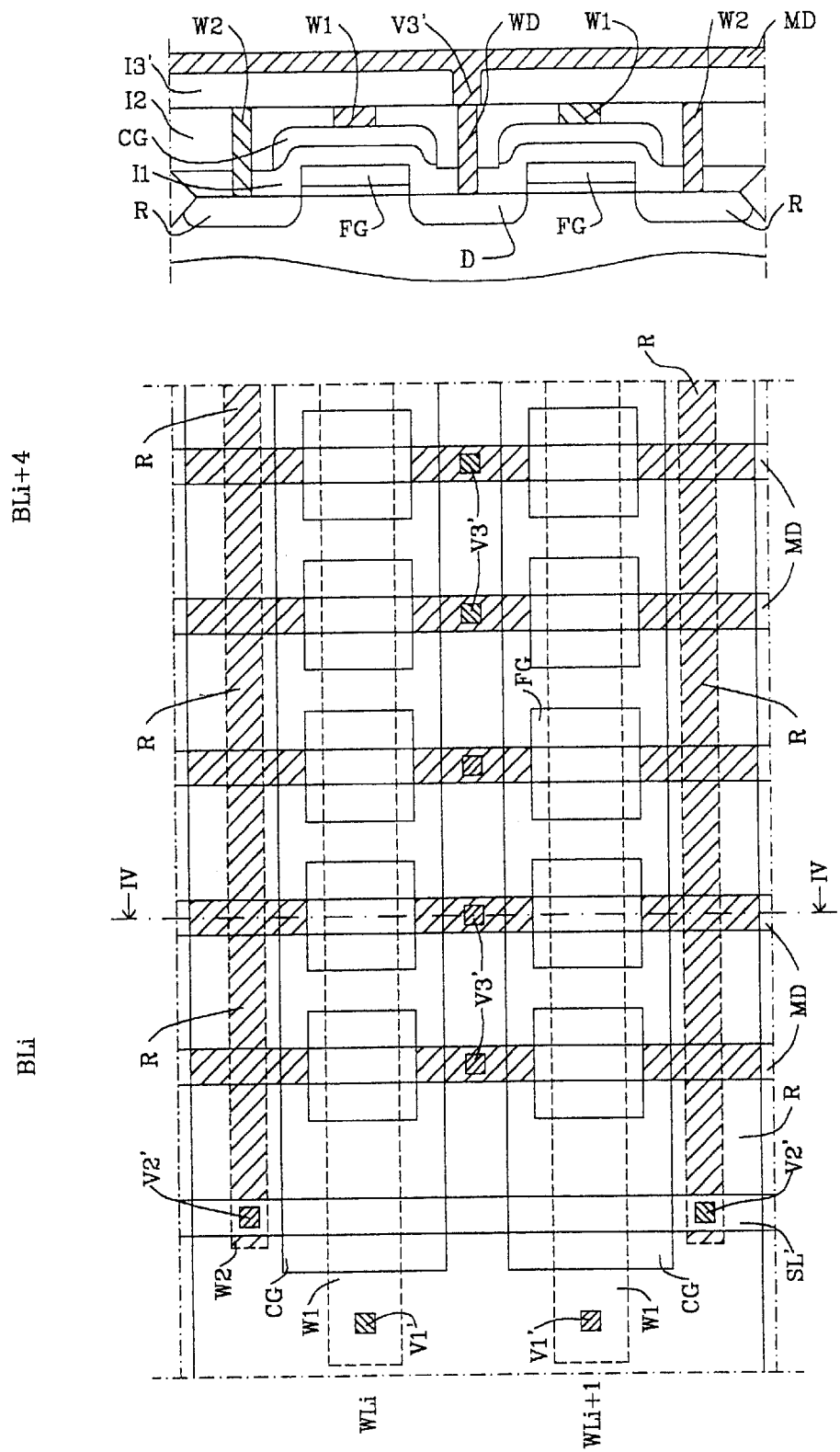
FIG. 3 shows, in plan, a portion of a non-volatile memory formed by the method according to the invention.
FIG. 4 shows a section of the memory of FIG. 3, taken on the line IV—IV of FIG. 3, and FIGS. 5a–5e show sections through the memory according to FIG. 3 at various stages of manufacture preceding that shown in FIG. 4.
Figure 5A:
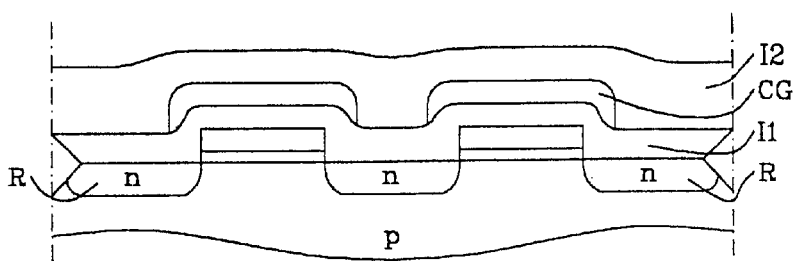
Figure 5B:
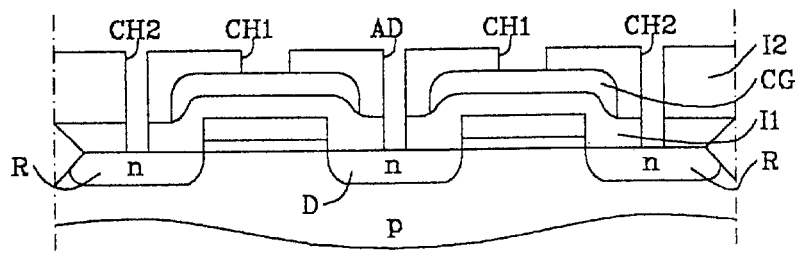

The matrix of memory cells shown in FIGS. 3 and 4 is produced by a method identical to that for the matrix of cells shown in FIGS. 1 and 2, up to the deposition of the second silicon dioxide layer I2. All identical elements are therefore indicated by the same reference symbols. According to the invention, the structure (FIG. 5a) is then subjected to a chemical-mechanical polishing (CMP) step in order to level the surface of the layer I2 and then to a selective removal of the oxide of the layers I2 and I1 by dry anisotropic etching. This latter step (FIG. 5b) forms a channel CH1 along each of the horizontal polycrystalline silicon strips CG which contain the control gate electrodes of the cells of each row and a channel CH2 along each of the diffused regions R which extend as horizontal strips in the monocrystalline silicon of the substrate and interconnect the source regions S of the cells of each row. During this step, openings AD are also formed to expose contact areas on the diffused drain regions D.

The channels extend through all of the oxide, that is, the layer I2 above the strips CG and the superimposed layers I1 and I2 on top of the source strips. They are delimited at the bottom by the surfaces of the respective polycrystalline silicon strips CG and monocrystalline silicon strips R.

Figure 5C:
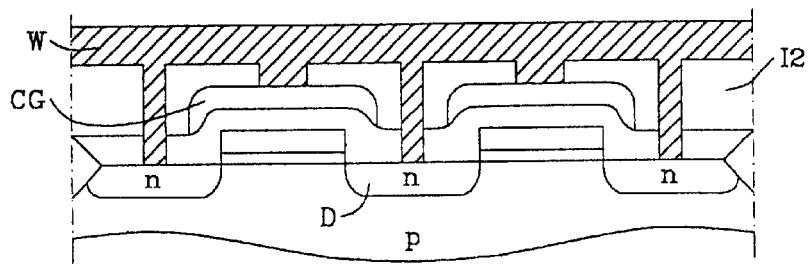
Figure 5D:
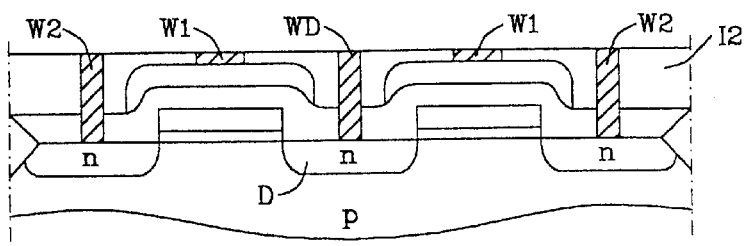

The channels thus formed are then filled with a material having a resistivity lower than that of the doped polycrystalline silicon of the strips CG and lower than that of the diffused regions R. The openings AD are filled with the same material. This step is advantageously performed by depositing (FIG. 5c) a layer W of tungsten until the channels CH1 and CH2 and the openings AD are filled and the layer I2 is covered and by then performing another chemical-mechanical polishing (CMP) step (FIG. 5d) to remove the tungsten from the surface of the layer I2, leaving the tungsten only in the channels CH1 and CH2 and in the openings AD. Tungsten strips W1 and W2 in contact with the polycrystalline silicon strips CG and with the diffused regions R, respectively, and elements WD for contact with the drain regions D, are thus formed. According to a known technique, a thin so-called barrier layer of a material which can improve the contact of the tungsten with the silicon, for example, titanium/titanium nitride (T, TiN) is preferably formed before the deposition of the tungsten.

Figure 5E:
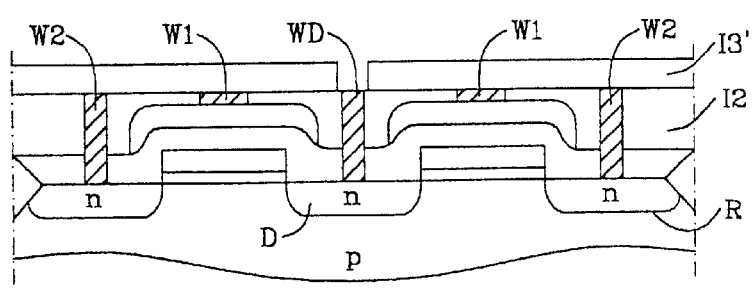

A further silicon dioxide layer I3' is deposited (FIG. 5e), contact areas are opened up above the tungsten strips W1 and W2 and above the interconnection elements WD, and a layer of metal, for example, aluminum, is then deposited, covering the oxide layer I3' and establishing a contact with the areas just opened up, forming elements V1' for interconnection with the strips W1, elements V2' for interconnection with and the strips W2, and elements V3' for interconnection with the interconnection elements WD.

Connections (not shown) for the row lines WLi, connections SL' between the tungsten strips W2 and a common node (not shown) and connection strips MD between the drain regions and respective terminals (not shown) of the bit lines BLi are formed from the aluminum layer by usual photolithography techniques.

It should be noted that a single metallization step, with the respective phototechnic steps, suffices to form these connections, rendering the method as a whole simpler than that of the prior art which requires two metallization steps. Moreover, by virtue of the low resistance of the connections between the control gate electrodes and between the source regions which is achieved by the tungsten strips W1 and W2, respectively, repeated connections along the row lines are not necessary, resulting in a considerable saving in area in comparison with the prior art.

Moreover, the usual silicide-forming steps which, as stated, are difficult when the surfaces to be treated are very narrow as in the case of the interconnections between the source regions, or have raised portions as in the case of the polycrystalline silicon strips which contain the control gate electrodes are not required. In one alternative embodiment, the combined polycrystalline layer CG and conductor W1 can be formed in or subjected to a high heat to provide a silicide at the control gate site.

It is important also to point out that the method according to the invention has a further considerable advantage when it is used to form connections in read-only non-volatile memories (ROMs) which are programmed during manufacture. In particular, the cells with which a logic "1" is to be associated are formed substantially as normal MOS transistors with a relatively low conduction threshold, whereas the cells with which a logic "0" is to be associated are formed with the use of a thick oxide layer, the field oxide, as the gate dielectric, and therefore have a very high conduction threshold which does not allow the cells to conduct at the usual voltages used for reading the memory. A characteristic of this structure is the relative ease with which it is possible to read the memory by microscope observation. In fact, the cells containing an "0" can easily be distinguished from those containing a "1" because they are raised in comparison with the latter. Naturally, this is a serious disadvantage if the memory contains confidential information, for example, a personal code on a credit card. With the method according to the invention, this disadvantage is in practice eliminated by virtue of the chemical-mechanical polishing (CMP) steps which render the final surface of the memory perfectly flat.

What is claimed is:

1. A method of forming low-resistivity connections in a non-volatile memory formed on a substrate of semiconductor material including memory cells arranged in rows and columns to form a matrix with row lines and column lines, each cell having a first terminal connected to a row line, a second terminal connected to a column line, and a third terminal connected to a common node by means of connection strips of a first, a second and a third plurality of connection strips, respectively, comprising:

forming a layer of dielectric material which covers the connection strips of at least one of the first, second and third pluralities of connection strips wherein each connective strip has a first resistivity;

selectively removing the dielectric material of the layer of dielectric material so as to form therein channels each of which extends along one of the connection strips of at least one of the first, second and third pluralities of connection strips and is delimited at a bottom surface of the dielectric thereby exposing a surface of the connection strip; and filling the channels with a material having a second resistivity lower than the first resistivity of each of the connection strips of the first, second and third pluralities of connection strips.

2. A method according to claim 1, in which the step of selectively removing the dielectric material comprises a leveling of the surface of the layer of dielectric material and anisotropic etching.

3. A method according to claim 2, in which the step of filling the channels comprises the deposition of tungsten and the removal of the tungsten until the layer of dielectric material is exposed, leaving the tungsten in the channels.

4. A method according to claim 3, in which, before the deposition of the tungsten, a layer of material which can improve the contact of the tungsten with the connection strips is formed in the channels.

5. A method comprising:

forming, on a semiconductor substrate material, a plurality of memory cells arranged in a matrix having row lines and column lines, each having first, second, and third teminals, wherein the first terminals of the memory cells of a given row of the matrix comprise a first conductive region, the second terminals of the memory cells of a given row comprise a second conductive region, and the third terminals of adjacent pairs of the memory cells of a given column comprise a plurality of conductive regions;

forming a first layer of dielectric material on the semiconductor substrate material and covering the memory cells;

forming a first channel in the first layer of dielectric material, which is delimited by the first conductive region and extends a substantial portion of the length thereof;

forming a second channel in the first layer of dielectric material, which is delimited by the second conductive region and extends a substantial portion of the length thereof;

forming a plurality of holes in the first layer of dielectric material, each of which is delimited by one of the plurality of conductive regions;

forming a layer of conductive material, having a lower resistivity than that of the first, second, or plurality of conductive regions, such that it fills the first channel, the second channel, and the plurality of holes, and making electrical contact thereby with the respective conductive regions;

leveling the surface of the conductive material and the layer of dielectric material, such that the conductive material is eliminated from the surface of the dielectric material, and remains only in the first channel, the second channel, and the plurality of holes, thereby electrically isolating the respective channels and plurality of holes;

forming a strip of conductive material above, and in electrical contact with the plurality of conductive traces;

forming a second layer of dielectric material on the upper surface of the first layer of dielectric material and covering the strip of conductive material;

forming a first additional hole in the second layer of dielectric material directly above the first channel, a second additional hole in the second layer of dielectric material directly above the second channel, and a third additional hole in the second layer of dielectric material directly above the strip of conductive material;

forming a first conductive trace, within and substantially filling the first additional hole, and in electrical contact with the conductive material in the first channel;

forming a second conductive trace, within and substantially filling the second additional hole, and in electrical contact with the conductive material in the second channel;

forming a third conductive trace, within and substantially filling the third additional hole, and in electrical contact with the strip of conductive material.

6. A method of forming connections in a device having a plurality of memory cells, comprising:

forming a dielectric layer on a first plurality, a second plurality and a third plurality of conductive lines wherein each conductive line of the first, second and third pluralities has a first resistivity;

selectively removing a portion of the dielectric layer on each of the first, second and third pluralities of conductive lines to an extent of exposing a surface of each of the first, second and third pluralities of conductive lines, and the portion extends a substantial distance of each of the conductive lines of the first, second, and third pluralities; and forming a conductive strip on each of the surfaces of the conductive lines on each of the first, second and third pluralities of conductive lines wherein the conductive line has a second resistivity and simultaneously electrically couples the plurality of memory cells.

7. The method according to claim 6 wherein the second resistivity of the conductive strip is less than the first resistivity of the conductive line.

8. The method according to claim 6 wherein the step of selectively removing a portion of the dielectric layer includes a planarizing of the surface of the dielectric layer and an anisotropic etching.

9. The method according to claim 6 wherein the step of forming the conductive lines includes depositing tungsten and removing tungsten such that the tungsten on the dielectric layer is removed and the tungsten in contact with the conductive lines remains.

10. A method of forming conductive lines in a memory device having memory cells formed in a matrix in a semiconductor substrate comprising:

forming a plurality of conductive regions having a surface and a first resistivity;

forming a dielectric layer on the plurality of conductive regions;

selectively removing the dielectric layer to form a removed portion of the dielectric layer to an extent such that the surface of each conductive region of the plurality of conductive regions is exposed, and such that the removed portion extends for a plurality of memory cells and is coincident with a substantial length of the conductive regions of the plurality of conductive regions; and forming a line within each removed portion of the dielectric layer of each of the conductive regions such that the line electrically contacts the surface of the conductive region, and the line having a second resistivity being less than the first resistivity of the conductive region.

11. The method according to claim 10 wherein the step of selectively removing the dielectric layer includes a planarizing of the surface of the dielectric layer and an anisotropic etching.

12. The method according to claim 10 wherein the step of forming the line includes a deposition of tungsten and a removal of tungsten such that the dielectric layer is exposed and the tungsten within the removed portion remains.

* * * * *

UNITED STATES PATENT AND TRADEMARK OFFICE
CERTIFICATE OF CORRECTION

PATENT NO. : 6,686,241 B2
DATED : February 3, 2004
INVENTOR(S) : Massimo Atti et al.

It is certified that error appears in the above-identified patent and that said Letters Patent is hereby corrected as shown below:

<u>Title page</u>,
Item [12], "Ati et al." should read as -- Atti et al. --.
Item [75], Inventors, "Massimo Atti" should read as -- Massimo Atti --.
Item [30], Foreign Application Priority Data, insert -- March 2, 2000 (Europe) 00830162 --.

<u>Column 5</u>,
Lines 60 and 61, "each having first, second, and third terminals," should read as -- each cell having first, second, and third terminals, --.

Signed and Sealed this

Twenty-second Day of June, 2004

JON W. DUDAS
*Acting Director of the United States Patent and Trademark Office*